(12) United States Patent
Rippel et al.

(10) Patent No.: US 6,674,164 B1
(45) Date of Patent: Jan. 6, 2004

(54) SYSTEM FOR UNIFORMLY INTERCONNECTING AND COOLING

(75) Inventors: Wally E. Rippel, Altadena, CA (US); Darrell Buchanan, Monrovia, CA (US)

(73) Assignee: Aerovironment, Inc., Monrovia, CA (US)

( * ) Notice: Subject to any disclaimer, the term of this patent is extended or adjusted under 35 U.S.C. 154(b) by 0 days.

(21) Appl. No.: 09/416,209

(22) Filed: Oct. 8, 1999

Related U.S. Application Data

(60) Provisional application No. 60/131,161, filed on Apr. 26, 1999.

(51) Int. Cl.$^7$ .............................................. H01L 23/34
(52) U.S. Cl. ....................................... 257/713; 361/689
(58) Field of Search ...................... 257/713; 361/696, 361/701, 679, 688, 689, 690

(56) References Cited

U.S. PATENT DOCUMENTS

| | | | |
|---|---|---|---|
| 4,544,942 A | 10/1985 | McCarthy | 357/81 |
| 4,648,008 A | 3/1987 | Neyroud et al. | 361/387 |
| 4,803,545 A | 2/1989 | Birkle | 357/81 |
| 4,872,089 A | 10/1989 | Ocken et al. | 361/388 |
| 4,899,255 A | 2/1990 | Case et al. | 361/386 |
| 4,989,070 A | 1/1991 | Iversen et al. | 357/82 |
| 5,225,965 A | 7/1993 | Bailey et al. | 361/386 |
| 5,309,319 A * | 5/1994 | Messina | 361/699 |
| 5,327,324 A | 7/1994 | Roth | 361/707 |
| 5,343,362 A | 8/1994 | Solberg | 361/710 |
| 5,396,404 A | 3/1995 | Murphy et al. | 361/719 |
| 5,450,284 A | 9/1995 | Wekell | 361/710 |
| 5,495,889 A | 3/1996 | Dubelloy | 165/104.33 |
| 6,016,007 A * | 1/2000 | Sanger et al. | 257/714 |
| 6,111,310 A * | 8/2000 | Schultz | 257/691 |

FOREIGN PATENT DOCUMENTS

| | | |
|---|---|---|
| DE | 3301 481 A1 | 9/1983 |
| DE | 40 02 060 A1 | 8/1991 |
| EP | 0 677 916 A2 | 10/1995 |
| FR | 2 500 215 | 8/1982 |
| FR | 2 607 911 | 6/1988 |
| FR | 2 775 416 | 8/1999 |

OTHER PUBLICATIONS

Saleh et al. Fundamentals of Photonics, John Wiley, 1991, pp 646–647.*

* cited by examiner

Primary Examiner—Douglas A. Wille
(74) Attorney, Agent, or Firm—Law Office of John A. Griecci

(57) ABSTRACT

A means is discussed for electrically interconnecting, cooling and mechanically supporting a multiplicity of heat producing electronic and/or electrical components which is amenable to automated assembly. A structure is identified which consists of one or more fluid-cooled heatsinks; which are in proximate contact with heat producing components and one or more U-shaped spring clips which mechanically force thermal contact between the heat producing components and heatsinks. In turn, each heatsink contains two fluid-filled cavities separated by a common wall, wherein fluid in the first cavity flows in one direction, while fluid in the second cavity flows in the reverse direction. The components are powered by a bus that compensates for the location of the components, providing an equal voltage drop between a power source and each component. The bus is a flat plate that has been stamped to include slots that increase the voltage drop between selected portions of the bus.

16 Claims, 9 Drawing Sheets

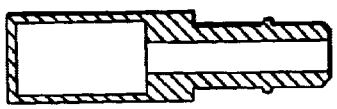
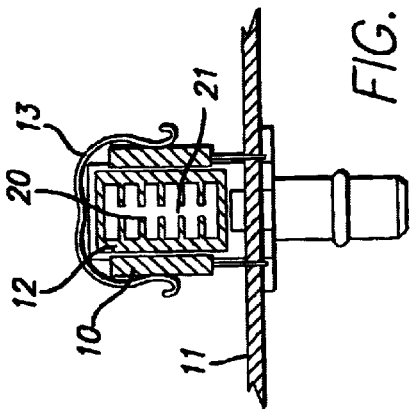
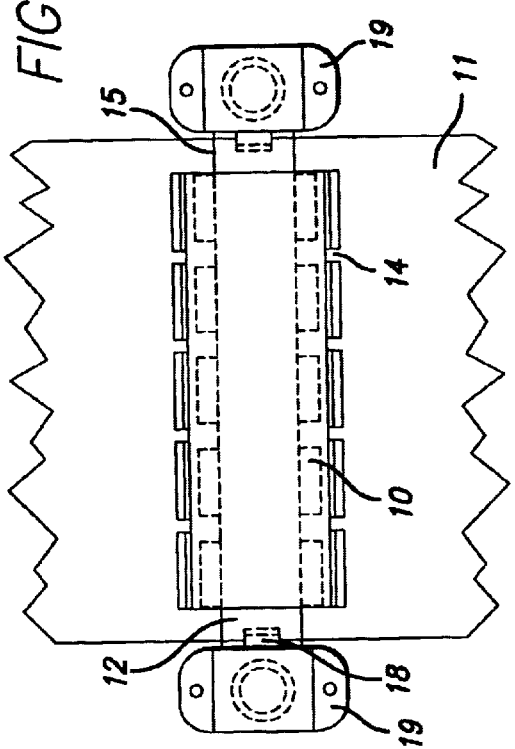
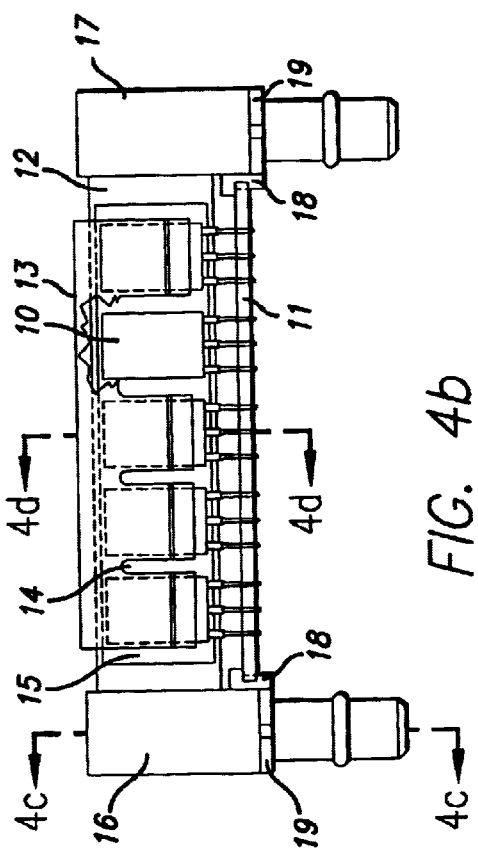

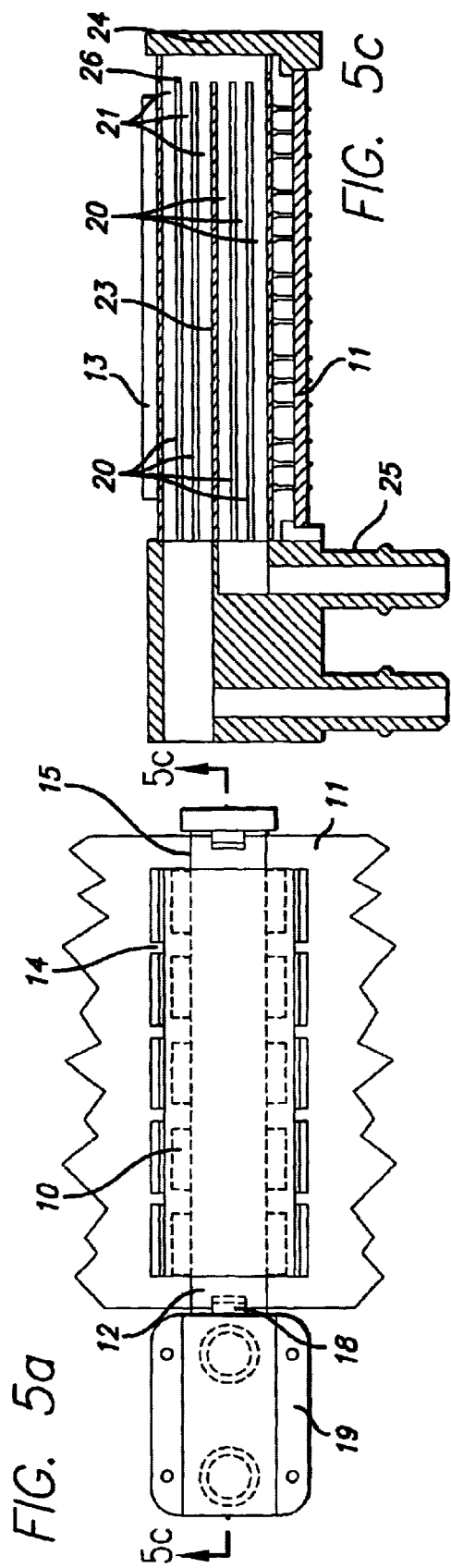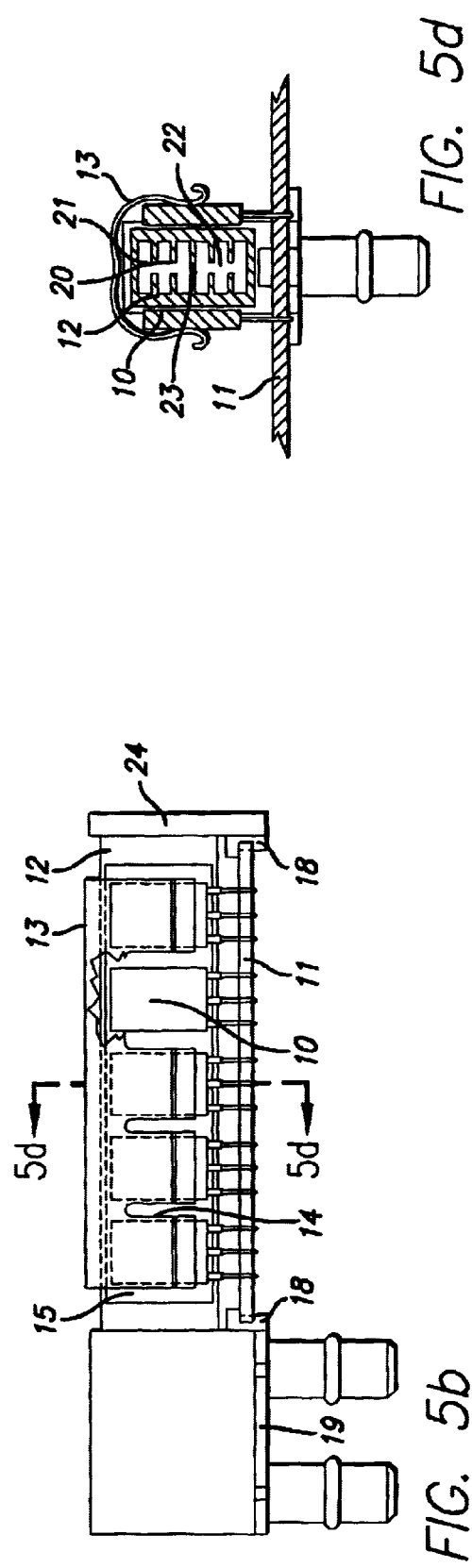

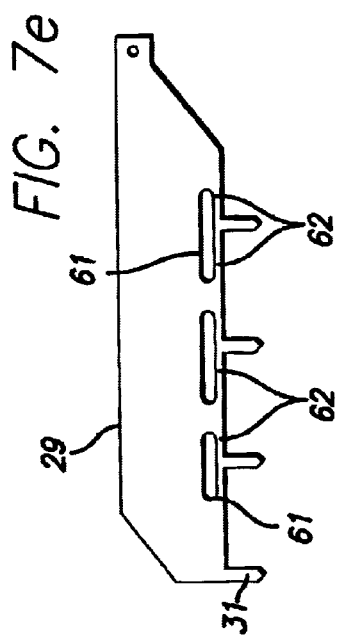
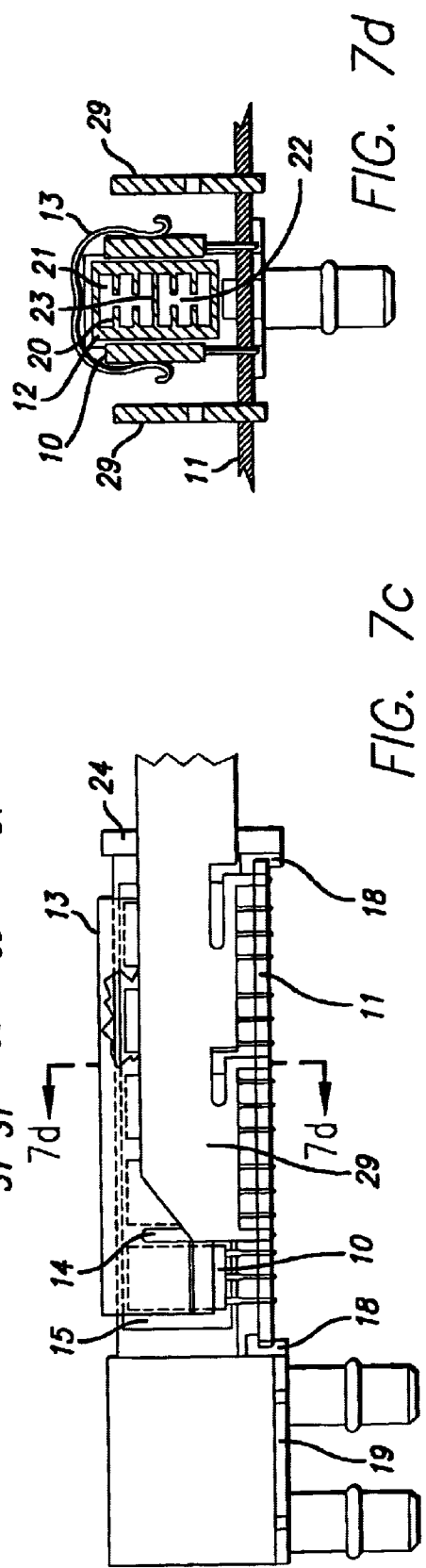
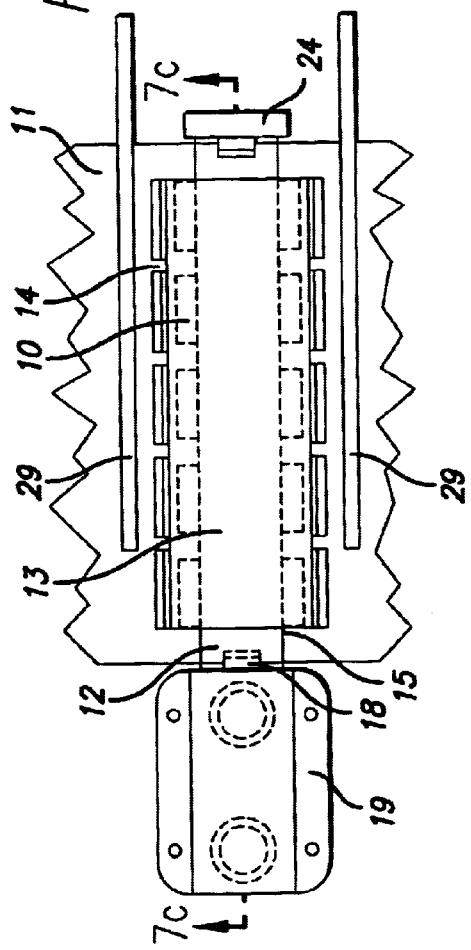
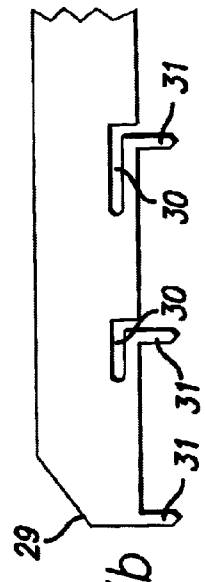

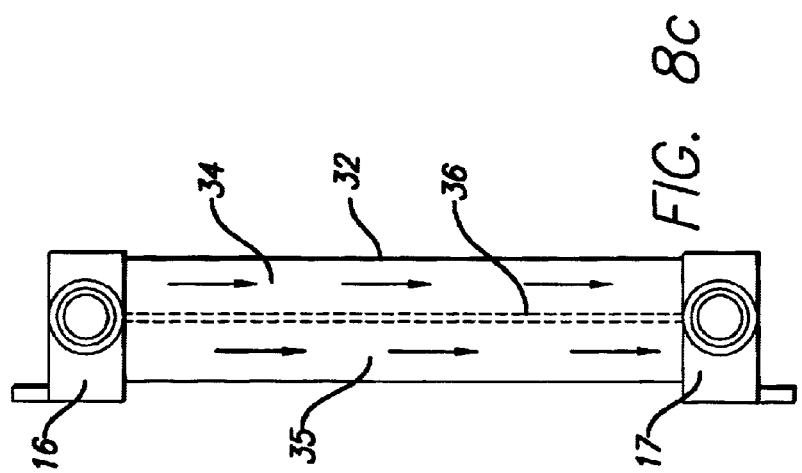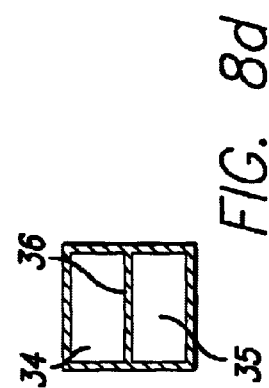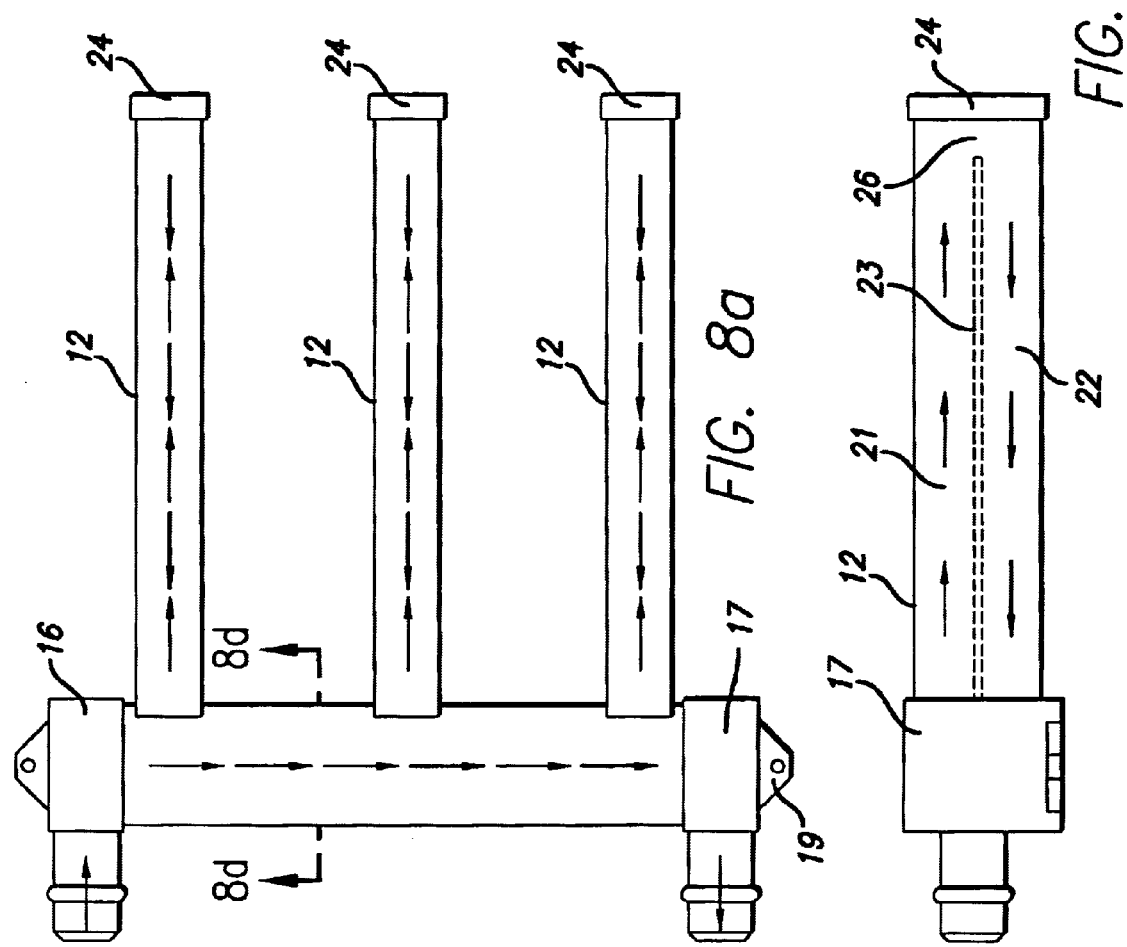

SYSTEM FOR UNIFORMLY INTERCONNECTING AND COOLING

This application claims the benefit of provisional application Ser. No. 60/131,161 filed Apr. 26, 1999.

BACKGROUND OF THE INVENTION

This invention relates generally to devices for interconnecting and/or cooling electrical components and, more particularly, to a power bus and heatsink for electrically connecting and cooling electrical devices, along with related methods.

Presently, power switching devices such as the insulated Gate Bipolar Transistor ("IGBT") are commercially packaged as both "discrete" and "modular" parts. Discrete parts, as typified by the popular TO-247 package, as sold by International Rectifier, Inc., have advantages of low packaging cost, compact size and low termination inductance. A typical manufacturing cost of the TO-247 package (less die and lead bonds) is about $0.12, while the typical termination (lead) inductance for this package is approximately 6 nH. Limitations of discrete packaged parts include a lack of electrical isolation and limited current capabilities. The maximum lead current capability for the TO-247 package is approximately 60 A.

Modular packaging has not become standardized to the degree that discrete parts have. An example of a popular modular package is the Powerex CM—DY package. One advantage of this type of packaging is the capability of packaging large total die areas so that high current ratings (more than 1000 A) can be achieved. Other advantages of the modular package include electrical isolation between the semiconductors and the heat-transfer surface and the capability of combining multiple semiconductor die so that several functions can be achieved within a single module.

Compared with discrete packaging, modular packaging has a number of disadvantages, including increased package cost and increased termination inductance. For modular devices, typical packaging costs are approximately equal to the bare Silicon die costs, whereas for the discrete packaged devices, the package cost is frequently less than 5% of the die cost. Accordingly, the manufacturing cost per VA for modular devices is nearly twice that of discrete devices. Furthermore, as die costs continue to fall more rapidly than packaging costs, this cost ratio between modular and discrete parts is expected to increase with time.

The termination inductance associated with modular packaging is also an increasing problem, as both die current ratings and die switching speeds are increasing with time. The net result is that for modular parts, voltage ratings must be reduced significantly below the die voltage rating—often more than 20%. In contrast, the required voltage derating for discrete packaged parts is negligible. This, in turn, adds to the cost advantage for discrete parts—and particularly to the cost average over time.

While discrete packaged parts have the stated inherent economic advantage over their modular counterparts, this advantage is presently more than offset by the costs associated with heatsinking, mounting and terminating these parts. In particular, where multiple discrete parts must be paralleled, suitable means must be used to insure current balancing and uniform die temperatures in order to ensure viable operation. Accordingly, a situation exists where the manufacturing costs for complete power systems could be significantly reduced if a technically and economically viable means were at hand for simultaneously interconnecting, heatsinking and mechanically supporting discrete semiconductor devices.

FIGS. 1a–1c illustrate a prior art design for power processing that is based on the use of semiconductor modules 50. Semiconductor modules 50 are mounted in thermal contact with heatsink 51 which has fluid inlet 53 and fluid outlet 52; semiconductor modules 50 are electrically connected to capacitors 56 via circuit board 57; electrical input termination is provided by buses 54 and 55; and semiconductor modules 50 are controlled by terminals 57. Advantages of this design include a low impedance interconnection between capacitors 56 and semiconductor modules 50, and an efficient use of space. However, the semiconductor modules themselves cost approximately twice the cost of equivalently rated discrete semiconductor parts.

FIGS. 2a and 2b illustrate a prior art design for power processing that is based on the use of discrete semiconductor devices 10. Discrete semiconductor devices 10 are horizontally mounted in thermal contact with heatsink 51; and discrete semiconductor devices 10 are electrically connected to capacitors 56 (and other components that are not shown) via circuit board 11. The advantages of this design include the low cost associated with the discrete semiconductor devices 10, the low impedance interconnections between capacitors 56 and discrete semiconductor devices 10, and the design's compatibility with commercially available heatsinks. However, this design is subject to high assembly costs, current limitations imposed by the circuit board foil resistance, high repair cost and inefficient use of space. The assembly cost is particularly high due to the fact that components are located on both sides of the circuit board, which makes automated soldering difficult or impossible. Included in the cost is the securing of each semiconductor device to the heatsink with individual hardware.

FIGS. 3a and 3b illustrate a prior art design for power processing that is based on the use of discrete semiconductor devices 10. Discrete semiconductor devices 10 are vertically mounted in thermal contact with heatsink 51; and they are electrically connected to capacitors 56 (and other components not shown) via circuit board 11. The advantages of this design include the low costs associated with discrete semiconductor devices 10, a low impedance interconnection between capacitors 56 and discrete semiconductor devices 10, and a moderately efficient use of space. The disadvantages of this design include a high assembly cost, the current limitations imposed by the circuit board foil resistance; and a high repair cost. The assembly costs are particularly high due to the fact that components are located on both sides of the circuit board, which makes automated soldering difficult or impossible.

Accordingly, there has existed a definite need for an energizing and cooling system, and related methods, for simultaneously interconnecting, heatsinking and mechanically supporting discrete semiconductor devices. The present invention satisfies these and other needs, and provides further related advantages.

SUMMARY OF THE INVENTION

The present invention provides an energizing and cooling system, a related method of cooling, and related methods of producing and installing such a system. It advantageously provides for devices, such as electrical components, to be efficiently and economically installed and used, with uniform power levels and uniform cooling.

In accordance with the present invention, a structure is defined which provides for the electrical interconnection, cooling and mechanical support of discrete semiconductor parts. Key elements of this structure include a conventional circuit board, a fluid-cooled heatsink which mounts on the component side of the circuit board, a spring clip which forces semiconductor devices installed in the circuit board into thermal contact with both front and rear surfaces of the heatsink, and electrically conductive buses which interconnect the circuit board with various components. Assembly of this structure may be fully automated using conventional fabrication means such as automated component insertion and wave soldering equipment.

The heatsink is typically an extruded aluminum tube having a rectangular outer cross-section and two liquid-filled interior chambers separated by a common wall. Interior surfaces of the heatsink may contain fins which protrude into the liquid to enhance heat transfer. At one end of the heatsink, the two chambers are made contiguous, thus establishing fluid counter-flow with respect to the common wall. The interior fluid is circulated by an external pump while heat contained in the fluid is transferred to ambient air by an external radiator and air blower.

An advantage of using two heatsink chambers with counter-flowing fluid (as compared with a single chamber arrangement) is that a more uniform thermal environment is provided for the components that are cooled by the heatsink. This is particularly important where a number of semiconductor components are connected in parallel, as uniform temperature is a requirement for both static and dynamic current balancing. A second advantage of the counter-flow arrangement is that the fluid inlet and fluid outlet may be combined into a single unit which saves packaging space and cost.

Two alternative embodiments are identified for the heatsink. In the first alternative embodiment, an aluminun extrusion is cut to length and, at one end, both the fins and the common wall are machined such that a contiguous region is achieved which allows fluid flow to connect from one chamber to the next in this region. A cap is sealed to this end to confine the cooling fluid to the interior chambers. As an alternate variation of a cap, a plug can be placed within the heatsink to accomplish approximately the same function. In the second alternative embodiment two cast members are bonded or welded together as a clam shell; and interior surfaces of each member contain pins which project into the fluid flow. This latter construction can achieve superior heat transfer compared to the first, but it has higher fabrication costs.

Individual heatsink members of either type may be integrated with a common two-chambered manifold to accommodate cooling for large numbers of components, while achieving desired length to width ratios for the completed equipment. Alternate two-chambered manifold designs can incorporate various flow paths, such as a counterflow design that provides for a manifold with a main inlet and outlet that are closely spaced, or such as a straight through design having a main inlet and main outlet at opposite ends. Individual heatsink members could also be integrated with separate inlet and outlet manifolds that are configured to conform to the heatsink inlet and outlet configuration. In alternate configurations, a manifold and a plurality of heatsinks could be cast as a single piece.

Termination for high currents is achieved by a unique sheet metal bus having fingers, which project outwardly from one edge of the sheet, pass through aligned holes within the circuit board and are soldered to electrically conducting surfaces on the circuit board. With the addition of appropriate slots and/or cuts, current distribution to the individual fingers may be controlled such that desired current ratios are achieved. In particular, such slots and cuts may be used to help maintain uniform current flow to a multiplicity of paralleled semiconductor devices which connect to the circuit board. The bus structure may be fabricated by low-cost stamping means.

A prototype three phase 100 kVA IGBT switch-mode amplifier has been built using methods of this patent. External dimensions of the amplifier are 10"×10"×3.5" (fluid circulating pump, radiator and radiator fan are external to the above amplifier). Measured thermal impedance between device junctions and the cooling fluid is 0.011 degrees Centigrade per Watt and measured thermal impedance between junction and ambient is 0.016 degrees Centigrade per Watt (the radiator cross section is 12"×12" and the air flow rate is 1800 ft/min).

Using the methods of this invention, complete power systems, such as invertors, amplifiers, regulators and the like, may be assembled by fully automated means. Typical assembly steps can include:
1. Insertion of components in circuit board including heat dissipating and associated components such as capacitors, resistors, diodes, control components and connectors
2. Installation of the heatsink (in a vertical motion downward relative to the circuit board with the heatsink's tongues aligning and engaging with circuit board slots)
3. Installation of one or more spring clips over the heat dissipating parts (this causes the heat dissipating parts to be clamped to the heatsink)
4. Insertion of power terminating sheet buses (in a vertical motion downward with respect to the circuit board, and with the bus fingers passing through holes in the circuit board)
5. Wave-soldering the "foil side" of the circuit board
6. Deflux cleaning of the circuit board The above method is not restricted in order, other than to require the insertion of all components to be inserted prior to the steps of wave soldering and deflux cleaning.

An alternative to the above method entails the use of a caddy, i.e., a dummy heatsink, in place of the heatsink in the above method. The caddy preferably includes grooves conforming to the components, so as to hold the components in a preferred position during the wave-soldering. After the soldering is complete, the spring clip and the caddy are removed. The heatsink may then be moved into place, and the components are then clipped to the heatsink using the spring clip. If more than one heatsink is to be used in either of the above methods, the heatsinks are preferably attached to the manifold prior to installation on the circuit board to simplify assembly.

Other embodiments of this invention can be configured to affect switch-mode power conversion, such as rectification, inversion, frequency conversion, regulation, power factor correction or amplification. Likewise, other embodiments can be configured to affect linear processes, such as linear amplification or linear regulation.

Other features and advantages of the invention will become apparent from the following detailed description of the preferred embodiments, taken in conjunction with the accompanying drawings, which illustrate, by way of example, the principles of the invention.

BRIEF DESCRIPTION OF THE DRAWINGS

FIG. 4A is a plan view of a first preferred embodiment of power processing unit including a heatsink and a spring clip mechanism of the present invention.

FIG. 4B is a front elevational view of the mechanism depicted in FIG. 4A.

FIG. 4C is a cross-sectional view of the mechanism depicted in FIG. 4A, taken along line A—A of FIG. 4B.

FIG. 4D is a cross-sectional view of the mechanism in FIG. 4A, taken along line B—B of FIG. 4B.

FIG. 5A is a top plan view of a second preferred embodiment of the present invention.

FIG. 5B is a front elevational view of the embodiment depicted in FIG. 5A.

FIG. 5C is a cross-section of a front elevational view of the embodiment depicted in FIG. 5A.

FIG. 5D is a cross-section of a side elevational view of the embodiment depicted in FIG. 5A.

FIG. 7A is a plan view of the first preferred embodiment of a power processing unit depicted in FIG. 4A, now including two power buses.

FIG. 7B is a front elevational view of a power bus as depicted in FIG. 7A.

FIG. 7C is a front elevational view of the mechanism depicted in FIG. 7A.

FIG. 7D is a cross-sectional view of the mechanism in FIG. 7A, taken along line B—B of FIG. 7C.

FIG. 7E is a front elevational view of an alternate embodiment of a power bus as depicted in FIG. 7A.

FIG. 8A is a top plan view of a fourth preferred embodiment of the present invention, which includes three heatsinks and manifold.

FIG. 8B is a front elevational view of the embodiment depicted in FIG. 8A.

FIG. 8C is a side view of the embodiment depicted in FIG. 8A.

FIG. 8D is a cross-sectional view of the embodiment depicted in FIG. 8A, taken along line C—C of FIG. 8A.

DETAILED DESCRIPTION OF THE PREFERRED EMBODIMENTS

Figure 1C:
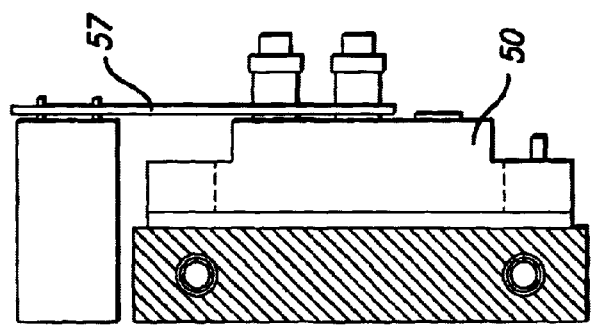
FIG. 1C is a left side view of the prior art power processing unit of FIG. 1A.
Figure 1A:
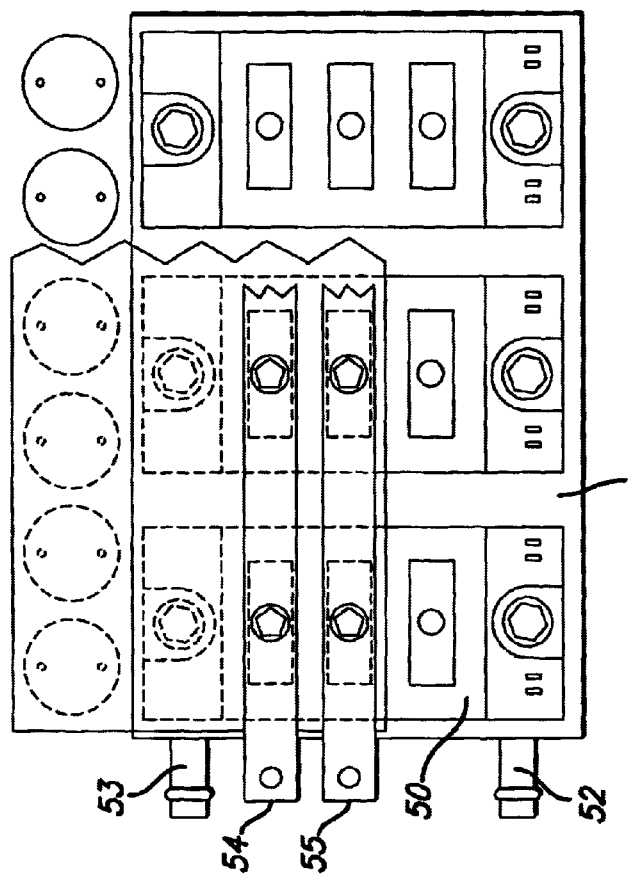
FIG. 1A is a plan view of a first prior art power processing unit using semiconductor modules.
Figure 1B:
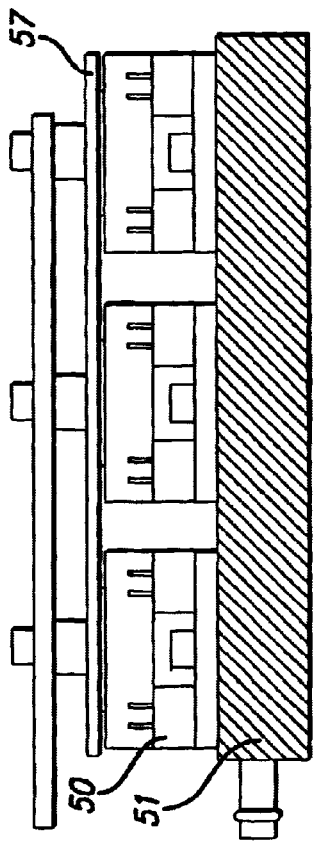
FIG. 1B is a front elevational view of the prior art power processing unit of FIG. 1A.
Figure 2A:
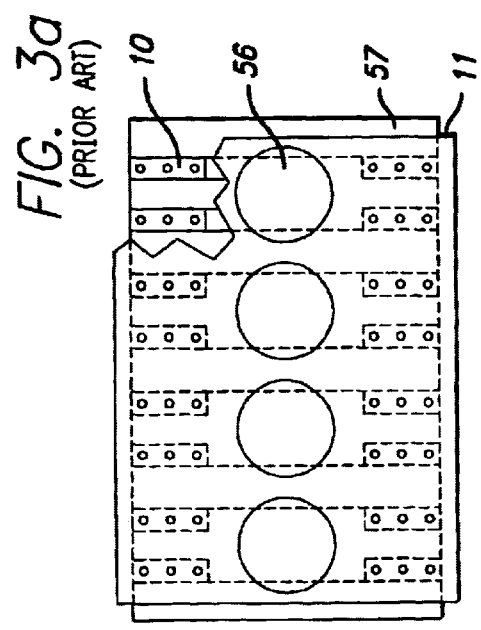
FIG. 2A is a plan view of a second prior art power processing unit, using discrete semiconductor parts that are horizontally mounted.
Figure 3A:
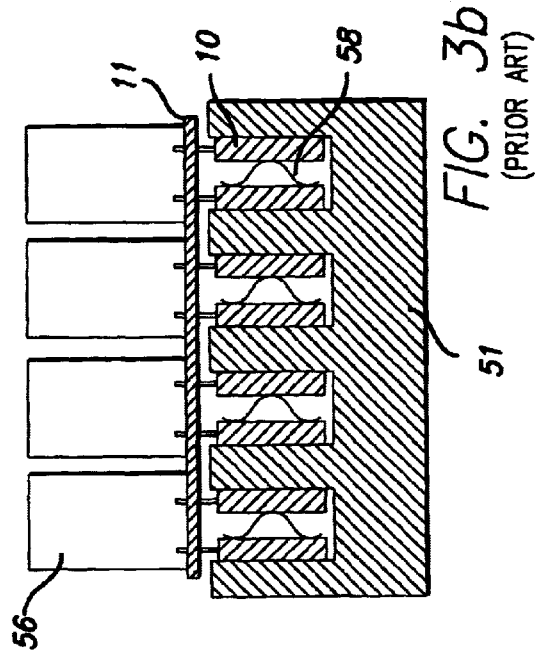
FIG. 3A is a plan view of a third prior art power processing unit, using discrete semiconductor parts that are vertically mounted.
Figure 2B:
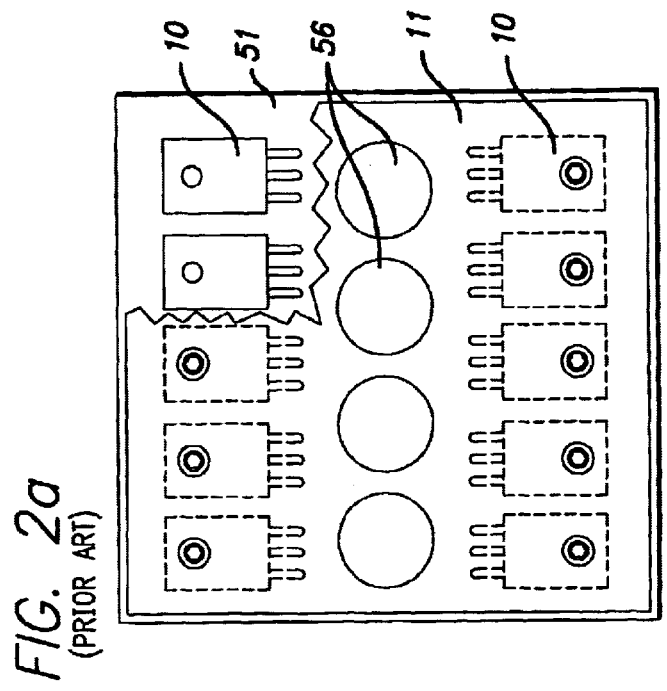
FIG. 2B is a front elevational view of the prior art power processing unit of FIG. 2A.
Figure 3B:
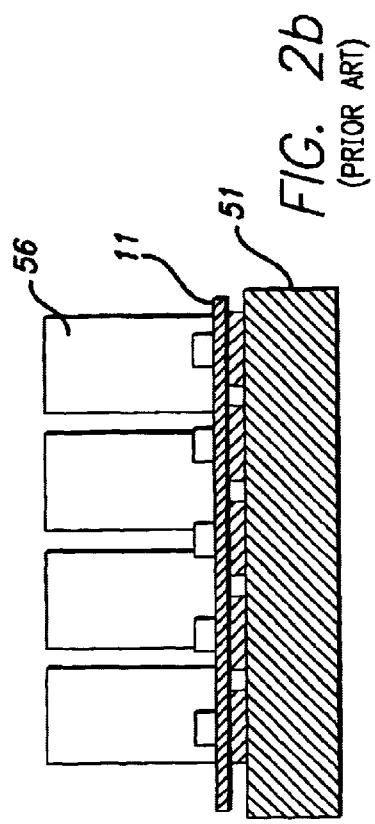
FIG. 3B. is a front elevational view of the prior art power processing unit of FIG. 3A.

Embodiments of an interconnecting and cooling system, related methods of energizing and cooling devices, and related methods of producing and installing such a system, are disclosed below. They advantageously provide for devices, such as electrical components, to be efficiently and economically installed and used, with uniform power levels and uniform cooling.

A device to be energized and cooled, and portions of a first preferred embodiment of a system for uniformly energizing and cooling the device, according to the present invention, are depicted in FIGS. 4A–D. The device includes discrete semiconductor devices 10, mounted on a circuit board 11. The system includes a fluid-cooled heatsink 12, a fluid inlet 16, a fluid outlet 17, alignment tongues 18, a spring clip 13 and insulating pads 15. Internal fins 20 enhance heat transfer from the heatsink to the cooling fluid that flows within the heatsink.

Semiconductor devices 10 are mounted to the circuit board 11 such that cooling faces of these parts contact both front and rear faces of heatsink 12, as shown in the section view of FIG. 4D. The front and rear faces of heatsink 12 are lined with thermally conducting insulating pads 15 to provide needed electrical isolation between the semiconductor devices 10 and the heatsink 12. The insulating pads are not necessary if the heatsink is composed of an electrically nonconductive material. Spring clip 13 effectively clamps and compresses each semiconductor device 10 into thermal contact with heatsink 12.

Figure 4E:
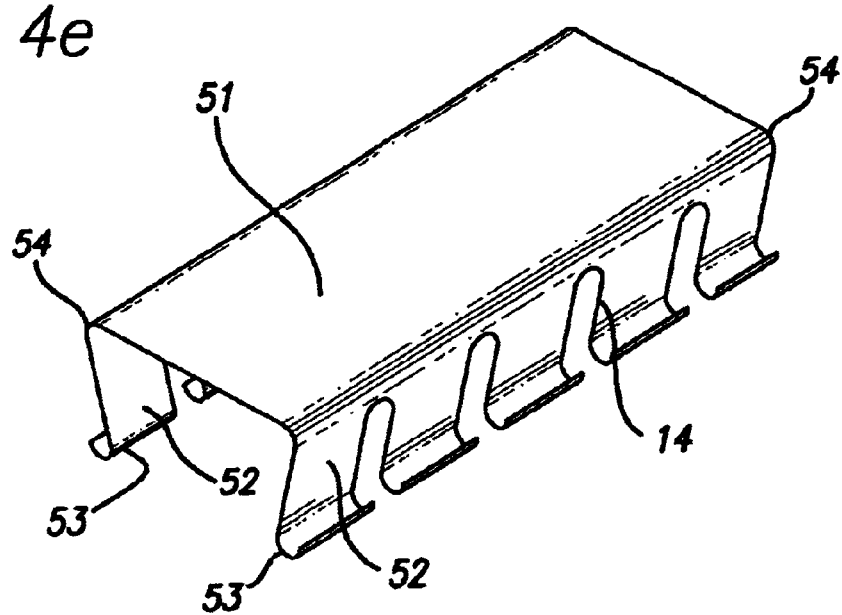
FIG. 4E is a perspective view of a spring clip configured to be used in the heatsink and spring clip mechansim of FIG. 4A.
Figure 4G:
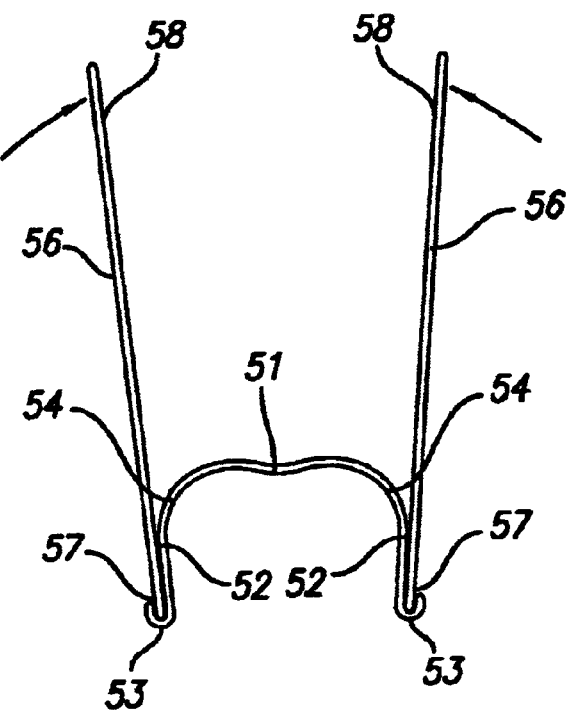
FIG. 4G is a side elevational view of the spring clip and handles of FIG. 4F, with the spring clip in a flexed position.
Figure 4F:
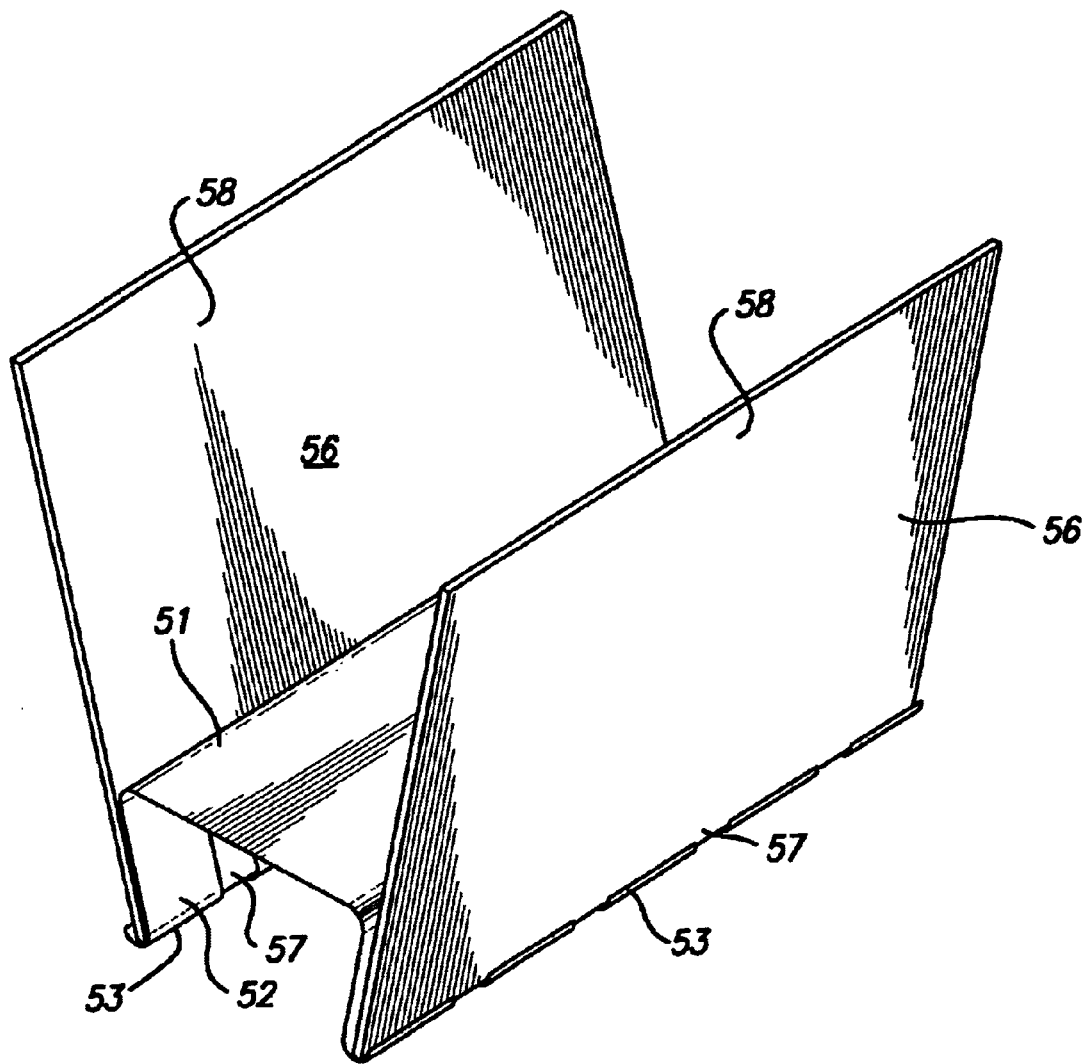
FIG. 4F is a perspective view of the spring clip FIG. 4E, along with two handles for the spring clip.

The spring clip 13, particularly seen in FIGS. 4E–4G, is an elongated member including an elongated base 51 and two elongated walls 52, each wall having a longitudinal edge 53 forming a U-shaped portion, and an opposing longitudinal edge 54. The elongated base connects the opposing longitudinal edges of the elongated walls to form a U-shaped spring. Both elongated walls include a plurality of slots 14 extending from the U-shaped portion edge toward the opposing longitudinal edge.

The longitudinal edges 54 of the elongated walls 52 of the spring clip 13 are bent in "U" shapes to enable external tooling to grasp and spread the clip during assembly (and disassembly, for repair). In particular, the overall spring clip mechanism includes two handles 56, each handle including an elongated edge 57 configured to be removably received in substantially the full length of the U-shaped longitudinal edge 53 of the elongated walls 52. Each handle also includes a handgrip portion 58. The handles and the spring clip are configured such that, with the elongated edges of the handles inserted into the U-shaped portion of the elongated walls, the handgrip portions can be urged toward each other to spread the U-shaped portions apart, using the opposing edges of the elongated walls as a fulcrum, as depicted in FIG. 4G.

Tongues 18, which are preferably integral elements of fluid inlet 16 and fluid outlet 17, are used to effectively align heatsink 12 with circuit board 11. Mounting feet 19, which are preferably integral elements of fluid inlet 16 and fluid outlet 17 are used to effectively mount the entire assembly to an external surface.

Heatsink 12 is preferably fabricated from aluminum by an extrusion process, and is preferably straight. Fluid inlet 16 and fluid outlet 17 may be aluminum castings or may be molded from plastic. In the case where fluid inlet 16 and fluid outlet 17 are aluminum, they may be united with heatsink 12 by welding.

In assembly, semiconductor devices 10 and other components (not shown) may be inserted into circuit board 11 using standard automated insertion equipment. After components are inserted, all connections may be soldered using a standard wave soldering device. In the final step, an assembled sub-unit, consisting of heatsink 12, fluid inlet 16, fluid outlet 17 and thermally conducting insulating pads 15, is installed with alignment tongues 18 engaging with slots in circuit board 11.

Spring clip 13 is then flexed to an open configuration by external tooling such as the handles 56, placed over the semiconductor devices 10, and released to clamp the semiconductor devices to the heatsink 12. The external tooling can be of a variety of designs that are configured to spread the U-shaped edges apart. The slots 14 in the spring clip provide isolation between the clamping force on each semiconductor device, and thereby allow uniform clamping forces to be applied to each semiconductor device, even where adjacent semiconductor devices have slightly different thicknesses. The slots thus help provide for uniform heat transfer between each semiconductor device and the heatsink.

Advantages of this embodiment include the low-cost of using discrete semiconductor devices, the low-cost of automated assembly using standard fabrication equipment, the efficient transfer of heat (i.e., low thermal impedance) between semiconductor parts and the cooling fluid, and the efficient use of space, because all of the parts project vertically from the same side of the circuit board. Another advantage of the FIG. 4 embodiment is that the semiconductor devices have the clamping pressure applied at a point directly over the internal semiconductor die—as opposed to at points on both sides of the internal semiconductor die, as some prior art configurations have. This provides improved heat transfer, especially when thermally conducting insulating pads 15 are sandwiched between the heatsink and the semiconductor devices. Yet another advantage of the spring clip arrangement is that a single rapidly installed clip provides accurate clamping forces for a large number of semiconductor devices; if repair is needed, this clip can be rapidly removed.

FIGS. 5A–5D illustrate a second preferred embodiment of the invention wherein heatsink 12 includes two chambers, 21 and 22 that are separated by common wall 23. Fins 20 project from the interior walls of both cavities, as is shown in FIGS. 5c and 5d, and extend from one end of each the chambers to the other. At one end of the heatsink, fins 20 and common wall 23 are removed to create a contiguous region 26 that allows cooling fluid to flow between chambers 21 and 22. Cap 24 is bonded to the end of the heatsink to provide fluid containment. At the opposite end of heatsink 12, inlet-outlet terminal 25 is bonded; this terminal serves to direct fluid from a first external hose (or pipe) into heatsink chamber 21 and to direct fluid received from chamber 22 into a second external hose (or Pipe). Other aspects of the FIG. 5 embodiment, including semiconductor devices 10, circuit board 11, spring clip 13, insulation pads 15, and alignment tongues 18 are similar to those of FIG. 4.

Heatsink 12 is fabricated from aluminum by an extrusion process. Fluid inlet 16 and fluid outlet 17 may be aluminum castings or may be molded from plastic, which has advantages as a nonconducting material. In the case where fluid inlet 16 and fluid outlet 17 are aluminum, they may be united with heatsink 12 by welding.

In addition to the advantages of the first preferred embodiment, the second preferred embodiment has two key areas of improvement. The first is that, due to fluid counterflow of the fluid within the heatsink (i.e., the fluid flows in opposite directions in the two chambers), a more uniform thermal environment is provided for the semiconductor devices 10. This occurs because, while the fluid heats up as it passes through the heatsink, the average temperature of the fluid is relatively constant along the length of the heatsink. This is further aided by the semiconductor devices being positioned such that their internal semiconductor die, i.e., their thermal center of heat generation, is centered ajacent to the common on the plane of the common wall 23, to receive a balance of the thermal effects from the two chambers of the heatsink, i.e., the thermal impedance between each chamber and the semiconductor devices is at a preferred, equal level.

The second additional benefit of the second preferred embodiment is that the packaging efficiency is increased by having the fluid inlet and outlet functions integrated at one location. This has the further benefit of locating both the fluid inlet and outlet hoses in mutual proximity.

Figure 6A:
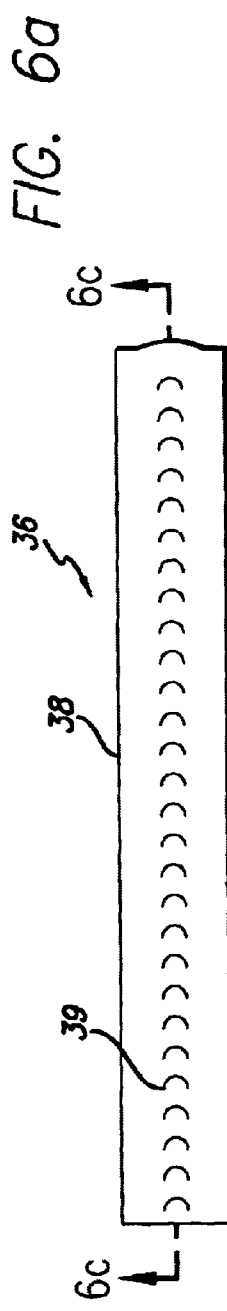
FIG. 6A is a top plan view of a third preferred embodiment of the heatsink of the present invention.
Figure 6B:
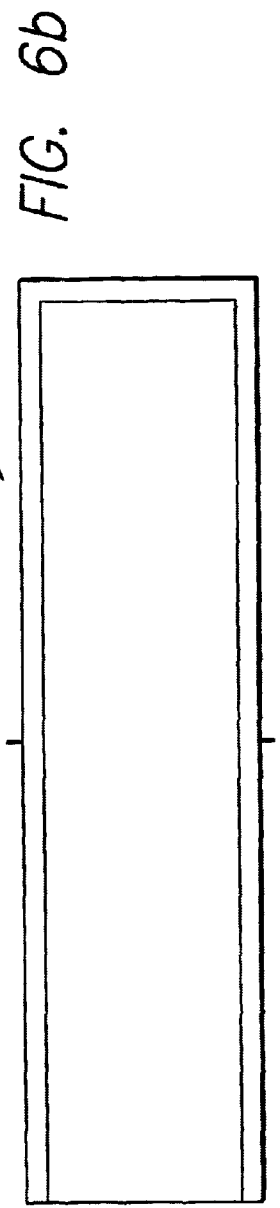
FIG. 6B is a front elevational view of the heatsink depicted in FIG. 6A.
Figure 6D:
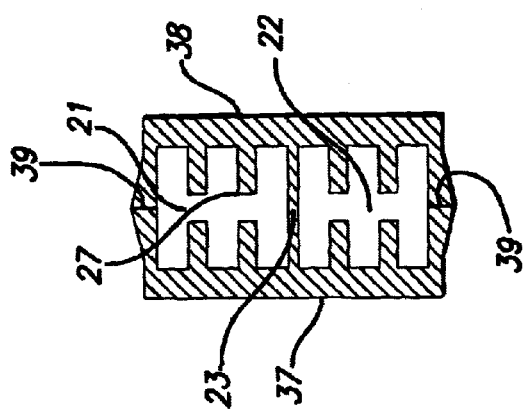
FIG. 6D is a cross-section of a side elevational view of the heatsink depicted in FIG. 6A.
Figure 6C:
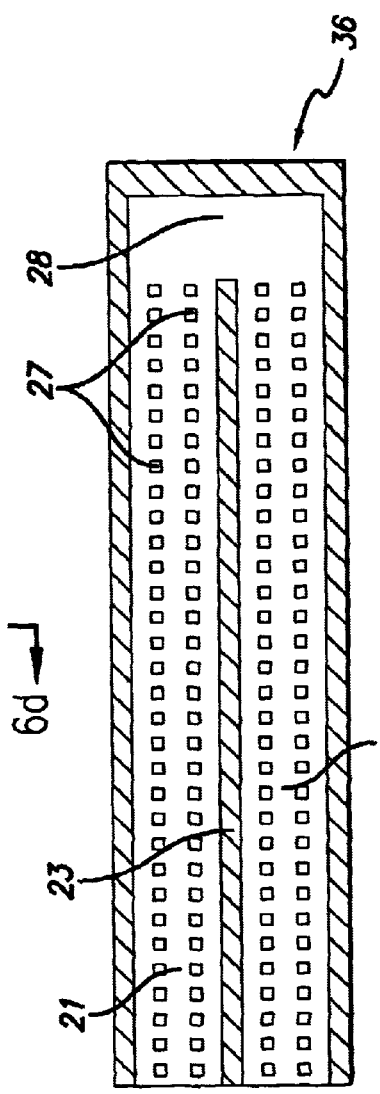
FIG. 6C is a cross-section of a front elevational view of the heatsink depicted in FIG. 6A.

FIGS. 6A–6D illustrate a third preferred embodiment having an alternative heatsink member, termed a pin-fin heatsink 36, which is constructed from two preferably identical machined aluminum or cast aluminum elements 37 and 38 that are welded together with weld seam 39. Internal pins 27 project from heatsink interior walls as shown in FIGS. 6C and 6D. Common wall 23 serves to separate interior chambers 21 and 22. With this heatsink 36, no cap 24 is required as can be seen from FIG. 6C. Similar to the embodiment of FIGS. 5A–5D, an inlet-outlet terminal may be welded or bonded to the open end. It should be noted that bonding the two halves of the common wall 23 is not necessary as small fluid leaks between chambers 21 and 22 through common wall 23 have negligible impact on the thermal performance. Likewise, it is not necessary to bond common wall 23 to interior partition portions of inlet-outlet terminal 25.

A main advantage of the pin-fin construction, compared with the extruded heatsink constructions shown in FIGS. 4A–4D and 5A–5D, is improved heat transfer. However, the pin-fin construction might be subject to higher fabrication costs.

FIGS. 7A–7D illustrate the second preferred embodiment of the invention, with the addition of two current collecting power buses 29. Each power bus 29 includes fingers 31 (i.e., separate connection terminals) that project from one edge and pass through aligned holes in circuit board 11 to provide electric current distribution to foil elements on the circuit board. Slots 30 are added, for example in the approximate locations shown, to provide the desired ratio of currents between the individual fingers.

As slot 30 widths are increased and as proximity to the bottom edge of the bus is reduced, the effective resistance associated with the proximate finger is increased; this has the effect of reducing the proportionate current flow associated with the finger in question.

In cases where, multiple semiconductor devices 10 are paralleled, conventional, nonslotted busing has the disadvantage of causing currents to be non-uniform; i.e., devices furthest from the termination end of the bus receive and handle reduced currents due to the voltage drop within the bus. In contrast, the slotted bus shown in FIG. 7b has the capability of achieving equal voltage drops between the primary terminal end and each of the respective fingers 31. This can provide for current to be shared equally, minimizing voltage spiking, switching stresses and trapped energy losses.

Only one power bus 29 is shown for reasons of clarity. In an actual application, two or more power buses would be used. These power busses are inexpensive, as they can be stamped out of sheet metal, plugged into the circuit board, and wave-soldered to the board along with the various other components. Another advantage of the FIG. 7 power bus is that it is vertically oriented; as such, packaging is efficient and the bus does not cover over or trap associated components. Furthermore, the bus can be bent to provide a series of connections that are not linear on the circuit board.

In more general terms, the power bus is configured with a shape and composition that interconnects specific locations with tailored voltage drops. Rather than the open-ended slots depicted in FIG. 7b, the bus could include other configurations to increase the voltage drop between to given locations. For example, oval cutouts 61 could be located between specific locations, such as the connecting terminals 31 and a primary terminal 63, as depicted in FIG. 7E, providing a multitude of current paths 62 (i.e., fingers) having various lengths and widths. In either case, gaps are used to create a predetermined voltage drop between selected terminals to achieve a desired voltage profile. Furthermore, the thickness, the composition, or other properties of the bus bar could be varied to control the voltage drops, as well as combinations of the above characteristics.

FIGS. 8A–8D illustrate a fourth preferred embodiment, having similarities with the second preferred embodiment, and preferably incorporating the above-described power bus. This embodiment includes a two-chambered manifold 32 which interconnects three (or any other number of) heatsinks. The two manifold chambers are separated by a common wall 36 as is shown in FIG. 8d. With this configuration, a fluid inlet 16 is in fluid communication with the manifold such that inlet fluid flow from a pipe or hose is directed to a first manifold chamber 34. Likewise, a fluid outlet 17 is in fluid communication with manifold 32 such that outlet fluid flow is directed from a second manifold chamber 35 to an outlet hose or pipe. Dual chambered heatsinks 12 are united with the manifold 32 such that first manifold chamber 34 is contiguous with the first chamber 21 of each heatsink 12 and likewise, the second manifold chamber 35 is contiguous with the second chamber 22 of each heatsink 12. Other elements of the invention, such as semiconductor devices 10, a circuit board 11, spring clips 13 and power busses 29 are not shown for reasons of clarity.

An advantage of this embodiment is that the overall dimensional ratios of the circuit board may be controlled as desired to achieve preferred values. This configuration could be varied to include heatsinks 12 united to both the right and left sides of manifold 32. The fact that only one manifold is used, as opposed to a scheme where manifolds are included on both ends of the heatsinks, is advantageous in that additional open spaces are provided for busing of high currents. However, such a configuration, which could use the first preferred embodiment of heatsink, are within the scope of the invention.

In the above embodiments, the cooling fluid is selected to meet the requirements of the system. For example, the cooling fluid might be a water-based fluid, or might be an oil. Furthermore, the system of the fluid filled heatsink may be partially evacuated, and the cooling fluid may boil at temperature lower than the temperature at which the plurality of power semiconductor devices normally operates, thereby providing for heat transfer via a phase change.

In some applications for embodiments of the invention, it may be preferable to compensate for devices that generate heat at variable levels. Thus, embodiments of the invention might preferably provide a variable fluid flux rate through the heatsinks based on the rate of heating of the devices. Such a system would likely require that the source of the fluid (such as a pump) be configured to pump the cooling fluid through the heatsink at a controllable rate. Additionally, such a system would likely require a controller configured to control the flow rate of the fluid through the heatsink as a function of the rate at which heat is generated by the devices. Information on the rate of heat generation could be based on sensors, or on usage, and would vary with the application.

From the foregoing description, it will be appreciated that the present invention provides an energizing and cooling system, related methods of energizing and cooling devices, and related methods of producing and installing such systems. They advantageously provide for devices, such as electrical components, to be efficiently and economically installed and used, with uniform power levels and uniform cooling.

While particular forms of the invention have been illustrated and described, it will be apparent that various modifications can be made without departing from the spirit and scope of the invention. In particular, while it is preferred that the heatsinks, spring clips, manifolds, and power busses of the invention be used as a synergistic group to form a singular energizing and cooling system, and that the preferred methods be employed to manufacture and use the invention, other embodiments of the invention are not so limited. Indeed, there are a wide variety of applications where such elements of the invention may be applied.

Thus, although the invention has been described in detail with reference only to the preferred embodiments, those having ordinary skill in the art will appreciate that various modifications can be made without departing from the invention.

We claim:

1. An apparatus for electrically interconnecting, thermally cooling and mechanically supporting a plurality of electrical components that require cooling, comprising:
   a circuit board mounting the plurality of components, wherein the circuit board is in electrical communication with each component; and
   a fluid-cooled heatsink in thermal communication with the plurality of components;
   wherein the plurality of electrical components that require cooling, and all other components on the circuit board, are on the same side of the circuit board so as to allow wave soldering of the circuit board;
   wherein the heatsink defines a first fluid-filled cavity and a second fluid-filled cavity that are separated by a common wall;
   wherein the heatsink is configured such that fluids in the second cavity flow in a direction along the common wall that is opposite of the direction of fluids flowing in the first cavity; and
   wherein the heatsink is configured such that each of the plurality of electrical components can be located along ends of the wall.

2. The apparatus of claim 1, and further comprising a power bus extending to the circuit board at a plurality of locations, wherein the power bus is on the same side of the circuit board as the plurality of electrical components that require cooling.

3. The apparatus of claim 2, wherein:

the power bus comprises a plate composed of an electrically conductive material characterized by electrical resistance;

the plate defines a primary terminal configured to attach to a power source;

the plate defines a plurality of connecting terminals, each connecting terminal being spaced from the primary terminal so as to connect to the plurality of locations on the circuit board; and the plate is configured to provide electrical resistance levels between the primary terminal and each connecting terminal having a prescribed relationship.

4. The apparatus of claim 3, wherein the plate is configured to provide equal voltage drops between the primary terminal and each connecting terminal.

5. A semiconductor power processing device, comprising:

a plurality of power semiconductor devices;

a circuit board mounting the plurality of devices, wherein the circuit board is in electrical communication with each of the plurality of device, and wherein the plurality of devices forming two rows of devices extending away from the circuit board in a direction normal to a surface of the circuit board; and a fluid-cooled heatsink in thermal communication with each of the plurality of devices, the heatsink extending between the two rows of devices and contacting the plurality of devices on heatsink surfaces normal to the surface of the circuit board; and a cooling fluid flowing through the heatsink;

wherein the plurality of electrical devices that require cooling, and all other components on the circuit board, are on the same side of the circuit board so as to allow wave soldering of the circuit board.

6. The device of claim 5, and further comprising additional components on the circuit board, the additional components having no direct thermal contact with the heatsink.

7. The device of claim 5, wherein the circuit board is composed of an insulating sheet and a single layer of copper foil pattern that is bonded to a face of the insulating sheet.

8. The device of claim 5, wherein the circuit board is composed of an insulating sheet and two layers of copper foil pattern that are bonded to opposite faces of the insulating sheet.

9. The device of claim 5, wherein the circuit board is composed of at least two insulating sheets interspaced with at least three layers of copper foil pattern.

10. The device of claim 5, wherein the cooling fluid is a water-based fluid.

11. The device of claim 5, wherein the cooling fluid is an oil.

12. The device of claim 5, wherein the fluid filled heatsink is partially evacuated, and wherein the cooling fluid boils at temperature lower than the temperature of the plurality of power semiconductor devices when they are in normal operation.

13. The device of claim 5, wherein the circuit board foil patterns and the plurality of power semiconductor devices are configured to effect switch-mode power conversion.

14. The device of claim 5, wherein the circuit board foil patterns and the plurality of power semiconductor devices are configured such that the power devices operate in a linear range.

15. The device of claim 5, wherein:

the heatsink includes a fluid inlet at one longitudinal end of the heatsink;

the heatsink includes a fluid outlet at the opposite end of the said heatsink; and the heatsink defines a cavity placing the inlet in fluid communication with the outlet.

16. The device of claim 5, and further comprising a power bus extending to the circuit board at a plurality of locations, the power bus comprising a plate composed of an electrically conductive material characterized by electrical resistance, wherein the plate defines a primary terminal configured to attach to a power source, and the plate defines a plurality of connecting terminals, each connecting terminal being spaced from the primary terminal so as to connect to the plurality of locations on the circuit board, and wherein the plate is configured to provide electrical resistance levels between the primary terminal and each connecting terminal having a prescribed relationship such that the plate is configured to provide equal voltage drops between the primary terminal and each connecting terminal.

* * * * *